(12) United States Patent
Lin et al.

(10) Patent No.: US 8,487,908 B2
(45) Date of Patent: Jul. 16, 2013

(54) DETECTOR CIRCUIT AND DETECT METHOD OF A CAPACITIVE TOUCH PANEL

(75) Inventors: Chia-Hsing Lin, Hsinchu (TW);
 Yi-Hsin Tao, Hsinchu (TW);
 Hsuan-Wen Tseng, Taipei County (TW)

(73) Assignee: Elan Microelectronics Corporation, Hsinchu (TW)

( * ) Notice: Subject to any disclaimer, the term of this patent is extended or adjusted under 35 U.S.C. 154(b) by 303 days.

(21) Appl. No.: 12/861,966

(22) Filed: Aug. 24, 2010

(65) Prior Publication Data

US 2011/0050633 A1 Mar. 3, 2011

(30) Foreign Application Priority Data

Aug. 27, 2009 (TW) .............................. 98128827 A

(51) Int. Cl.
 *G06F 3/045* (2006.01)
 *G06F 3/041* (2006.01)
 *G06F 3/033* (2006.01)
 *G06F 3/044* (2006.01)
 *G01R 27/26* (2006.01)

(52) U.S. Cl.
 USPC ........... 345/174; 345/173; 345/179; 324/658; 178/18.06

(58) Field of Classification Search
 USPC ..................... 345/173, 174; 178/18
 See application file for complete search history.

(56) References Cited

U.S. PATENT DOCUMENTS

2010/0053097 A1* 3/2010 Goh et al. ..................... 345/173

* cited by examiner

*Primary Examiner* — Kent Chang
*Assistant Examiner* — Kuo Woo
(74) *Attorney, Agent, or Firm* — Rosenberg, Klein & Lee

(57) ABSTRACT

A detector circuit and detect method of a capacitive touch panel conditionally abort detection of useless traces of the capacitive touch panel when the capacitive touch panel detects the traces thereof. For a selected trace, first several digital values obtained by detecting the selected trace are compared with a threshold value to identify whether the selected trace is useful or not, and if the selected trace is identified useless, an abort signal is triggered to abort detection of the selected trace. Therefore, the performance of the capacitive touch panel is improved with higher frame rate and less power consumption.

3 Claims, 2 Drawing Sheets

DETECTOR CIRCUIT AND DETECT METHOD OF A CAPACITIVE TOUCH PANEL

FIELD OF THE INVENTION

The present invention is related generally to a touch panel and, more particularly, to a detector circuit and a detect method of a capacitive touch panel.

BACKGROUND OF THE INVENTION

A two-dimensional capacitive touch panel includes a plurality of X-traces and a plurality of Y-traces mutually intersected to form a plurality of sensors. When an electrically conductive article such as a finger approaches a sensor, the coupling capacitor between the finger and the sensor will increase the capacitance on the trace connected to the sensor, so a detector circuit can locate the finger on the capacitive touch panel by detecting the capacitance variations of the traces, and then convert the position coordinates into information for a host to perform corresponding operation.

In further detail, as shown in FIG. 1, when a finger touches the intersection point between a Y-trace Y1 and X-traces X4 and X5, the measured capacitances from those X-traces X1, X2, X7 and X8 that are far from the finger will not be affected by the finger and remain below a threshold $C_{TH}$, the measured capacitances from those X-traces X3 and X6 near the finger will be increased to slightly higher than the threshold $C_{TH}$, the measured capacitance from the X-trace X5 is even higher, and the measured capacitance from the X-trace X4 where the finger touches is at the peak of the curve 16 established by the measured capacitances from the X-traces X1-X8. Similarly, the measured capacitance from the Y-trace Y1 is at the peak of the curve established by the measured capacitances from the Y-traces, since the Y-trace Y1 is touched by the finger. Therefore, the capacitive touch panel can identify the touch point (X4,Y1). The capacitances on the X-traces X1, X2, X7 and X8 are not affected by the finger, so the measured capacitances therefrom are too low to be useful in the subsequent conversion and calculation for identification of the touch point.

In actual circuitry the capacitance can not be detected directly, and thus a capacitive touch panel performs the capacitance detection by charging its traces one by one and detecting the voltage variations on each of the traces to extract the capacitance variations of the traces. After conversion and processing, the position information is obtained for a host.

The present invention provides a solution for a capacitive touch panel to pre-filter out useless traces and thereby reduce the operation of the detector circuit of the capacitive touch panel. Therefore, the performance of a capacitive touch panel can be improved with higher frame rate and less power consumption.

SUMMARY OF THE INVENTION

An object of the present invention is to provide a circuit and method for conditionally aborting detection of useless traces of a capacitive touch panel when the capacitive touch panel detects the traces thereof.

According to the present invention, a detector circuit of a capacitive touch panel having a plurality of traces includes an analog-to-digital converter, a low-pass filter connected to the analog-to-digital converter, and a threshold comparator connected to the low-pass filter. The low-pass filter has m+n registers, where m and n are nature numbers, and an arithmetic unit connected to the m+n registers. The analog-to-digital converter detects a selected one of the traces for m times to generate m digital values, the m+n registers store the m digital values sequentially, and the threshold comparator compares the m digital values with a threshold value. If the m digital values are below the threshold value, the threshold comparator triggers an abort signal for aborting detection of the selected trace; otherwise the analog-to-digital converter further detects the selected trace for n times to generate n digital values to store in the m+n registers for the arithmetic unit to average the m+n digital values.

According to the present invention, a detect method of a capacitive touch panel having a plurality of traces includes detecting a selected one of the traces for m times to generate m digital values, where m is a nature number, storing the m digital values, and comparing the m digital values with a threshold value. If the m digital values are below the threshold value, an abort signal is triggered for aborting detection of the selected trace; otherwise the selected trace is further detected for n times to generate n digital values, where n is a nature number, the n digital values are stored, and the m+n digital values is averaged.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Conventionally, when a capacitive touch panel detects the traces thereof for the capacitances on each of the traces by a digital approach, it usually repeatedly charges a selected trace and detects the voltage thereon for several times, and converts the several detected voltages of the selected trace into digital values. For each trace, the several digital values are averaged as the measured capacitance from this trace. The same process is repeated for all the traces one by one to obtain a frame of information to locate a touch point on the capacitive touch panel. The steps of repeatedly detecting a trace and averaging the extracted digital values for the trace are for minimizing the noise influence on the trace, as the step of low-pass filtering an analog signal in analog circuitry to filter out the noise thereof.

Figure 1:
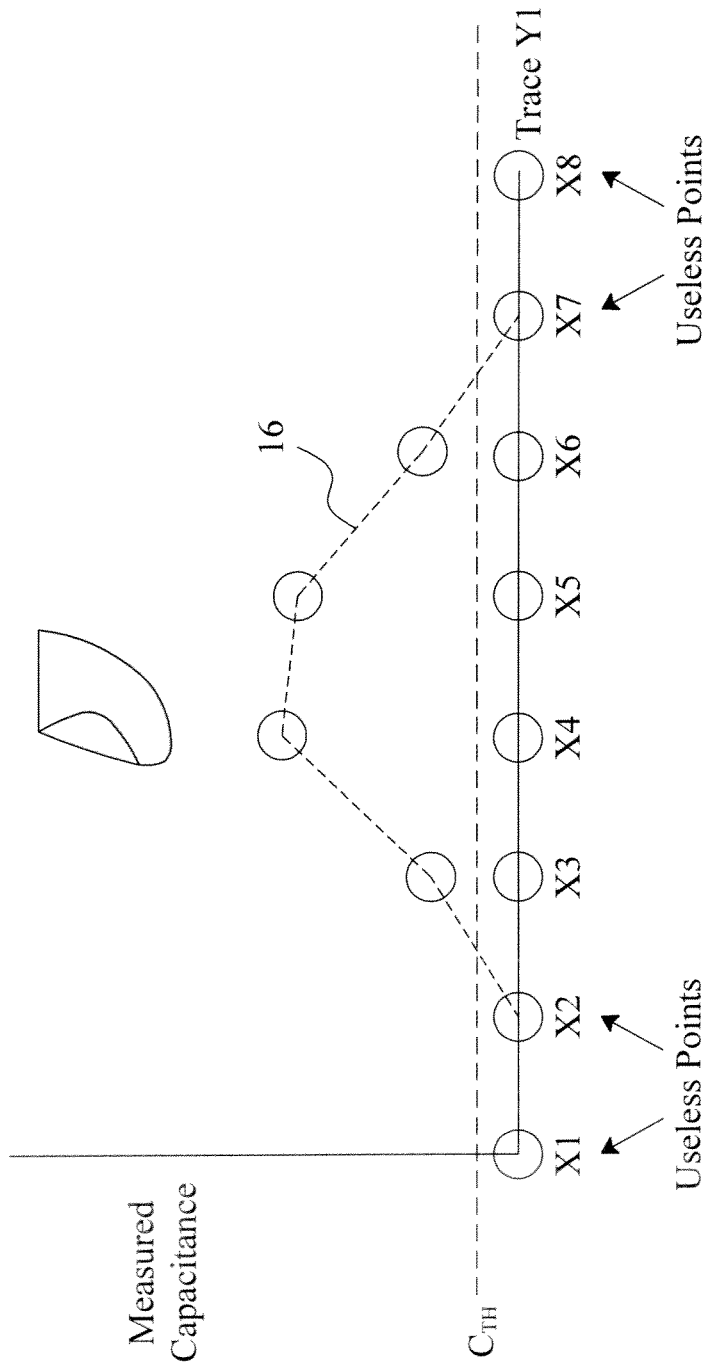
FIG. 1 is a schematic diagram showing the measured capacitances from X-traces along a Y-trace when a finger touches at the intersection of the Y-trace and one of the X-traces.
Figure 2:
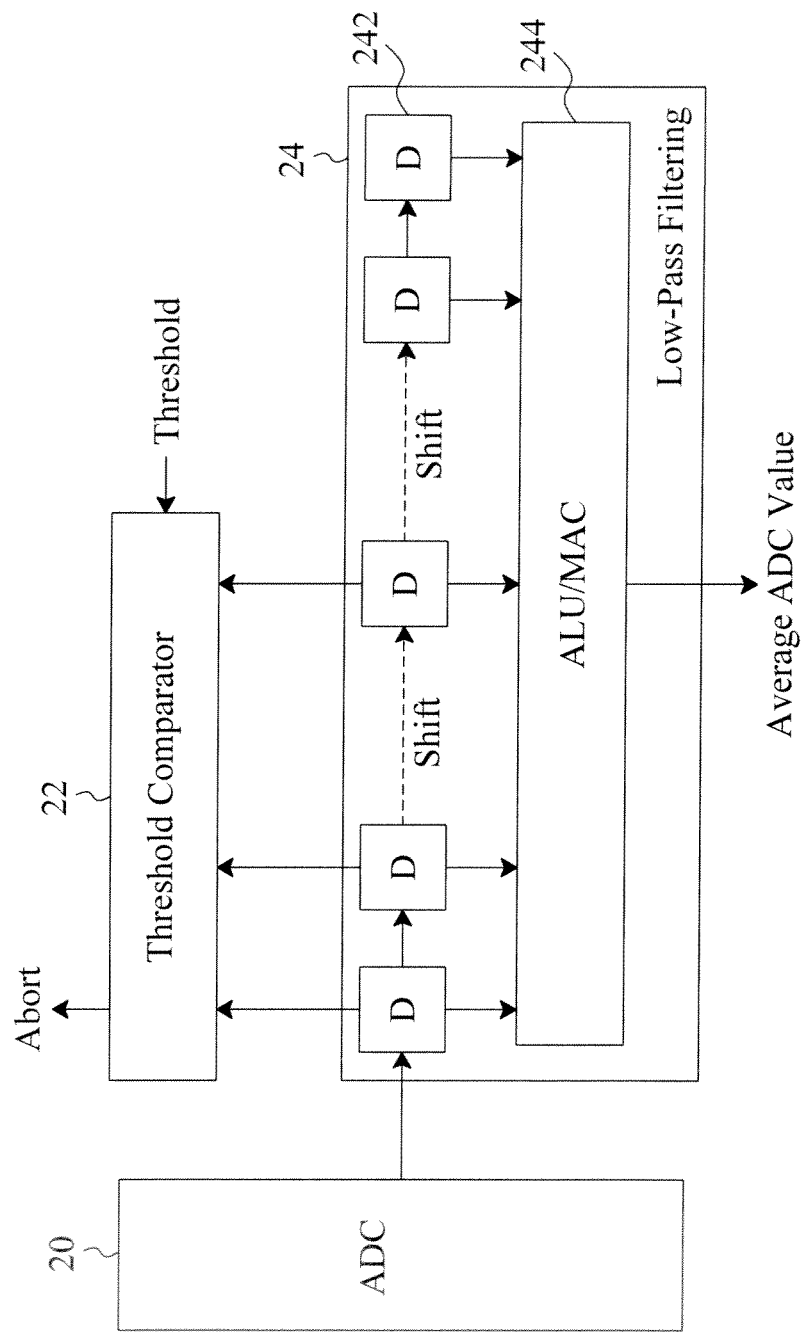
FIG. 2 is a circuit diagram of an embodiment according to the present invention.

FIG. 2 is a circuit diagram of an embodiment according to the present invention. For an example, it is assumed that a trace will be detected for five times to generate five digital values when detecting this trace for the capacitance thereon. For a trace under detection, each of the detected trace voltages is converted into a digital value by an analog-to-digital converter 20 to input to a low-pass filter 24 which has a string of registers 242 to store the digital values. Each of the registers 242 stores one of the digital values detected from the trace, and the digital values are stored into the registers 242 sequentially from the left to the right. In other words, when a digital value is stored into the string of registers 242, all the digital values already stored in the registers 242 will shift rightward by a register. In an embodiment, when detecting a trace for the capacitance thereon, the first three digital values of the trace are compared with a threshold value Threshold by a threshold comparator 22. If the first three digital values are all below the threshold value Threshold, the threshold comparator 22 triggers an abort signal Abort for aborting detection of this trace. That is, the last two times for detecting this trace will not be performed, and the process will jump to proceed with the next trace. For comparison of the first three digital values with the threshold value Threshold, it may compare them with the threshold value Threshold one after another, or it may first average them and then compare the average with the threshold value Threshold. If the first three digital values are above the threshold value Threshold, the threshold comparator 22 will not trigger the abort signal Abort, so the analog-to-digital converter 20 keeps detecting the trace to obtain and convert the last two trace voltages into digital values to store into the string of registers 242, and then an arithmetic unit in an ALU/MAC 244 averages the five digital values of the trace stored in the string of registers 242 to generate an average ADC value for a firmware to fill it in a frame.

In the above embodiment, after an abort signal Abort for aborting detection of a trace is triggered, it may skip the operation for the trace by means of software or firmware, or it may directly fill the value of this trace in a frame with zero, so that operation for all useless traces are reduced. In actual circuitry, when establishing a frame of information, a detector circuit of a capacitive touch panel typically detects a trace for two, four, six or even eight times and then detects the next trace with the same steps. Taking a capacitive touch panel having N X-traces and N Y-traces for example, where N is a nature number, to complete a frame, it is necessary to scan 2N (=N+N) traces and each trace has to be detected for M times, where M is a nature number, so operation for M×2N times is required for a frame. Differently, a detect method according to the present invention is capable of identifying whether a trace is useful or not in the first several times of detection to the trace, so as not only to omit unnecessary subsequent data conversion, but also to omit repeated scan for useless traces, thereby effectively reducing the operation and in turn improving the frame speed and reducing the power consumption.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A detector circuit of a capacitive touch panel having a plurality of traces, the detector circuit comprising:

an analog-to-digital converter for converting an analog signal of a selected trace taken from the plurality of traces to a digital value, the selected trace selected m times to generate m digital values, where m is a natural number;

a low-pass filter connected to the analog-to-digital converter, the low-pass filter including:

m+n registers for storing the m digital values sequentially, where n is a natural number; and an arithmetic unit connected to the m+n registers; and a threshold comparator connected to the low-pass filter for comparing the first m digital values in the m+n registers with a threshold value, wherein when the m digital values are below the threshold value, the threshold comparator triggers an abort signal for aborting detection of the selected trace prior to a shifting of the digital values of said selected trace to said n registers in said m+n registers, whereby said analog-to-digital converter shifts to a next selected trace of said plurality of traces; and when the m digital values are above the threshold value, the analog-to-digital converter further detects the selected trace for n times to generate n digital values, said n digital values not compared with said threshold value before being stored into said m+n registers for the arithmetic unit to average the m+n digital values.

2. A detect method of a capacitive touch panel having a plurality of traces, the detect method comprising the steps of:

detecting a selected one of the traces for m times to generate m digital values, where m is a natural number;

storing the m digital values;

comparing the m digital values with a threshold value; and when the m digital values are below the threshold value, triggering an abort signal for aborting detection of the selected trace; and when the m digital values are above the threshold value, further detecting the selected trace for n times to generate n digital values, storing the n digital values, said n digital values not compared with said threshold value before being stored into said m+n registers, and averaging the m+n digital values.

3. The detect method of claim 2, wherein the step of comparing the m digital values with a threshold value comprises the steps of:

averaging the m digital values for generating an average digital value; and comparing the average digital value with the threshold value.

* * * * *